(12) United States Patent
Park et al.

(10) Patent No.: US 11,783,908 B2
(45) Date of Patent: Oct. 10, 2023

(54) STACKED SEMICONDUCTOR DEVICE AND SEMICONDUCTOR SYSTEM INCLUDING THE SAME

(71) Applicant: SK hynix Inc., Gyeonggi-do (KR)

(72) Inventors: Young Jun Park, Gyeonggi-do (KR);
Young Jun Ku, Gyeonggi-do (KR);
Sang Sic Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 211 days.

(21) Appl. No.: 17/530,291

(22) Filed: Nov. 18, 2021

(65) Prior Publication Data
US 2022/0076769 A1    Mar. 10, 2022

Related U.S. Application Data

(63) Continuation-in-part of application No. 16/889,378, filed on Jun. 1, 2020, now Pat. No. 11,398,290.

(30) Foreign Application Priority Data
Oct. 11, 2019   (KR) ........................ 10-2019-0126120

(51) Int. Cl.
*G11C 7/00* (2006.01)
*G11C 29/12* (2006.01)
(Continued)

(52) U.S. Cl.
CPC ........ *G11C 29/12015* (2013.01); *G11C 7/222* (2013.01); *H01L 25/0657* (2013.01);
(Continued)

(58) Field of Classification Search
CPC ................ G11C 29/12015; G11C 7/22; H01L 2207/2281; H01L 2225/06513; H01L 2225/06541
(Continued)

(56) References Cited

U.S. PATENT DOCUMENTS 7,698,088 B2    4/2010 Sul et al.
8,720,235 B2 *  5/2014 Geyer ..................... D06F 58/02
                                              68/144
(Continued)

FOREIGN PATENT DOCUMENTS

| KR | 10-0721581 B1 | 5/2007 |
| KR | 10-0894504 B1 | 4/2009 |
| KR | 10-2020-0112040 A | 10/2020 |

OTHER PUBLICATIONS

Notice of Allowance issued by the USPTO dated Mar. 24, 2022.

*Primary Examiner* — Viet Q Nguyen
(74) *Attorney, Agent, or Firm* — IP & T GROUP LLP

(57) ABSTRACT

A memory device includes a first data strobe pad; a strobe signal generation circuit suitable for generating a read data strobe signal based on a read timing signal; a monitoring receiver suitable for receiving the read data strobe signal fed back through the first data strobe pad according to a monitoring enable signal; a sampler suitable for generating a sampling clock by sampling the fed back read data strobe signal according to a random clock; a first counter suitable for generating a first counting signal by counting the random clock; a second counter suitable for generating a second counting signal by counting the sampling clock; and a duty detector suitable for generating a duty ratio detection signal based on the first counting signal and the second counting signal.

16 Claims, 12 Drawing Sheets

(51) Int. Cl.
*H01L 25/065* (2023.01)
*G11C 7/22* (2006.01)
(52) U.S. Cl.
CPC ............. *G11C 2207/2281* (2013.01); *H01L 2225/06513* (2013.01); *H01L 2225/06541* (2013.01)
(58) Field of Classification Search
USPC .......................................... 365/193
See application file for complete search history.

(56) References Cited

U.S. PATENT DOCUMENTS

| | | | |
|---|---|---|---|
| 8,730,757 B2 * | 5/2014 | Shimizu | G11C 16/32 365/233.13 |
| 8,804,264 B1 | 8/2014 | Yeung et al. | |
| 9,535,119 B2 * | 1/2017 | Thiruvengadam | G01R 31/3171 |
| 10,529,398 B1 * | 1/2020 | Lee | G11C 29/028 |
| 11,621,032 B2 * | 4/2023 | Tajima | G11C 7/222 365/230.08 |
| 2015/0310931 A1 | 10/2015 | Lee | |
| 2015/0371692 A1 | 12/2015 | Song | |

* cited by examiner

FIG. 11B

| M1 | M0 | FUNCTION |
|----|----|----------|
| 0  | 0  | RESET    |
| 0  | 1  | LFSR     |
| 1  | 0  | REGISTER |
| 1  | 1  | MISR     |

STACKED SEMICONDUCTOR DEVICE AND SEMICONDUCTOR SYSTEM INCLUDING THE SAME

CROSS-REFERENCE TO RELATED APPLICATION

This application is a continuation-in-part of U.S. patent application Ser. No. 16/889,378, filed on Jun. 1, 2020, which claims benefits of priority of Korean Patent Application No. 10-2019-0126120, filed on Oct. 11, 2019. The disclosure of each of the foregoing application is incorporated herein by reference in its entirety.

BACKGROUND

1. Field

Various embodiments of the present disclosure relate to a semiconductor device, and more particularly, to a stacked semiconductor device, and a semiconductor system including the same.

2. Discussion of the Related Art

In order to satisfy demands for miniaturization and mounting reliability of semiconductor devices, a packaging technology for a plurality of semiconductor chips has been continuously developed. Particularly, as a semiconductor memory technology is rapidly developed, high integration and high performance are gradually required for a packaging technology of semiconductor memory chips. Therefore, beyond a two-dimensional structure, in which semiconductor memory chips are two-dimensionally disposed on a printed circuit board (PCB) by using wires and bumps, a variety of technologies related to a three-dimensional structure, in which a plurality of semiconductor memory chips are vertically stacked, are being developed.

As a stacked memory device having a three-dimensional structure is integrated and miniaturized, the size of a pad provided to a signal transfer port for communicating with a system is also decreasing. For example, the use of smaller pads, such as micro bumps, has made it difficult to directly test the pads by using pins of a test equipment.

Recently, a semiconductor device in the form of a system on chip (SOC), in which a memory device and a memory controller such as a CPU and a GPU are fabricated in a single package form, is mainly used. A pad of the memory device provided to such a semiconductor device may have a structure that is not exposed to the outside.

Therefore, the memory device may perform a test by using a separate pad provided for the test. In the memory device that is integrated and miniaturized, the number of test pads may be limited and a technology capable of testing the memory device by using a limited number of test pads is required.

SUMMARY

Various embodiments of the present disclosure are directed to a stacked semiconductor device capable of feeding back data through read/write paths and testing circuits on the read/write paths by using the fed-back data, and a system including the same.

Various embodiments of the present disclosure are directed to a semiconductor device including a monitoring circuit capable of receiving a read data strobe signal, which is fed-back through a read data strobe pad, and capable of monitoring a duty ratio of the fed-back read data strobe signal. Further, various embodiments of the present disclosure are directed to a semiconductor device capable of implementing a counter, which is included in the monitoring circuit, with a multiple input signature register (MISR) circuit which is originally provided for verifying an interface with a controller.

In an embodiment of the present invention, a semiconductor device may include: a first data strobe pad; a strobe signal generation circuit suitable for generating a read data strobe signal based on a read timing signal; a monitoring receiver suitable for receiving the read data strobe signal fed back through the first data strobe pad, according to a monitoring enable signal; a sampler suitable for generating a sampling clock by sampling the fed back read data strobe signal according to a random clock; a first counter suitable for generating a first counting signal by counting the random clock; a second counter suitable for generating a second counting signal by counting the sampling clock; and a duty detector suitable for generating a duty ratio detection signal, based on the first counting signal and the second counting signal.

In an embodiment of the present invention, a stacked semiconductor device may include: a base chip including: a first data strobe pad, a strobe signal generation circuit suitable for generating a read data strobe signal based on a read timing signal, and a monitoring circuit suitable for generating a sampling clock by sampling the read data strobe signal fed back through the first data strobe pad according to a random clock, and monitoring a duty ratio of the read data strobe signal based on first and second counting signals which are generated by respectively counting the random clock and the sampling clock, during a monitoring operation; and at least one core chip stacked over the base chip.

In an embodiment of the present invention, a semiconductor device may include: a sampler suitable for generating a sampling clock by sampling a data strobe signal according to a random clock; a first counter suitable for generating a first counting signal by counting the random clock; a second counter suitable for generating a second counting signal by counting the sampling clock; and a duty detector suitable for detecting a duty ratio of the data strobe signal based on the first and second counting signals.

In accordance with the present technology, during a test operation, a memory device may feed back data through the read/write paths thereof. Furthermore, it is possible to perform an operation on the fed-back data and confirm an operation result through a test path of the memory device. Consequently, various circuits on the read/write paths of the memory device may be tested by using a limited number of test pads on the test paths. Furthermore, it is possible to improve test operation efficiency of the memory device, to reduce the fabricating cost of the memory device.

In accordance with the present technology, a semiconductor device may feed back a read data strobe signal through a read data strobe pad thereof to monitor the duty ratio of the fed-back read data strobe signal. Consequently, it is possible to improve the signal integrity (SI) of the read data strobe signal ensuring a high-speed operation between the semiconductor device and the controller. In addition, by utilizing the existing MISR circuit, it is possible to monitor the duty ratio of the read data strobe signal while minimizing the increase in the area of the semiconductor device.

BRIEF DESCRIPTION OF THE DRAWINGS

FIG. 11B is a table for describing an operation of the second counter of FIG. 11A in accordance with an embodiment of the present invention.

DETAILED DESCRIPTION

Figure 1:
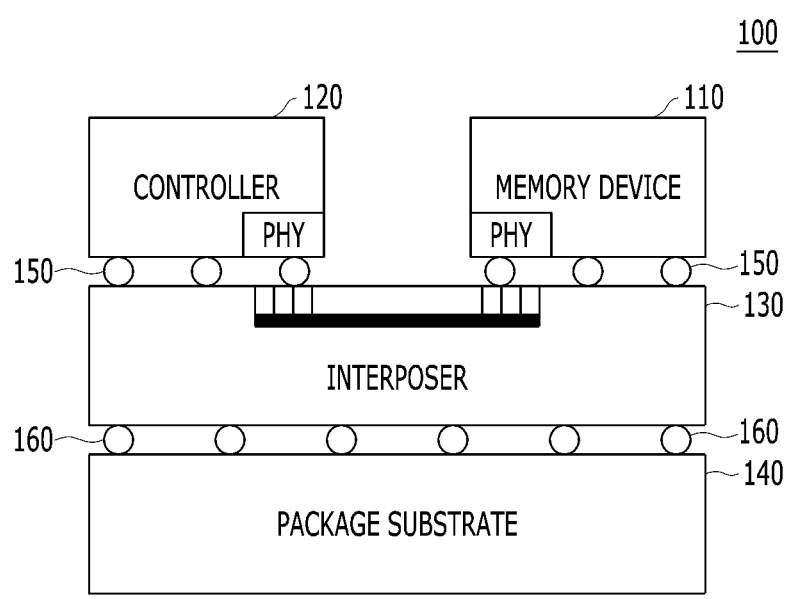
FIG. 1 is a diagram illustrating a semiconductor system in accordance with various embodiments of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when one element is referred to as being 'connected to' or 'coupled to' another element, it may indicate that the former element is directly connected or coupled to the latter element or electrically connected or coupled to the latter element with another element interposed therebetween. Furthermore, when an element "includes" or "comprises" a component, it means that the element does not exclude another component but may further include or comprise another component, unless referred to in the contrary. Moreover, although components described in the specification are represented in a singular form, the present embodiment is not limited thereto, but the corresponding components may also be represented in a plural form.

As illustrated in FIG. 1, a semiconductor system 100 in accordance with various embodiments of the present invention may have a system on chip (SOC) structure. The semiconductor system 100 may include a memory device 110, a controller 120, an interposer 130, and a package substrate 140.

The memory device 110 may be a volatile memory device such as a DRAM, or may be a nonvolatile memory device such as a FLASH memory device, a phase change memory device (PCRAM), a resistive memory device (ReRAM), a ferroelectric memory device (FeRAM), a magnetic memory device (MRAM), and a spin injection magnetic memory device (STTRAM). Alternatively, the memory device 110 may be composed of a combination of two or more of the volatile memory device and the nonvolatile memory device. In accordance with an embodiment, the memory device 110 may be a stacked memory device including a plurality of chips. The configuration of the memory device 110 will be described in more detail with reference to FIG. 2.

The controller 120 may include a central processing unit (CPU), a graphics processing unit (GPU), a digital signal processor (DSP), an application processor (AP), a controller chip, a memory controller chip and the like.

The memory device 110 and the controller 120 may be stacked on the interposer 130 and may be electrically connected to each other through micro bumps 150. The memory device 110 and the controller 120 may communicate with each other through a signal path formed in the interposer 130. That is, interfaces PHY of the memory device 110 and the controller 120 may be connected to each other through the interposer 130.

The interposer 130 may be stacked on the package substrate 140, and may be electrically connected through an electrical connection means 160 such as a bump ball and a ball grid array. Signal paths for transmitting signals may be formed in the interposer 130 and the package substrate 140.

Figure 2:
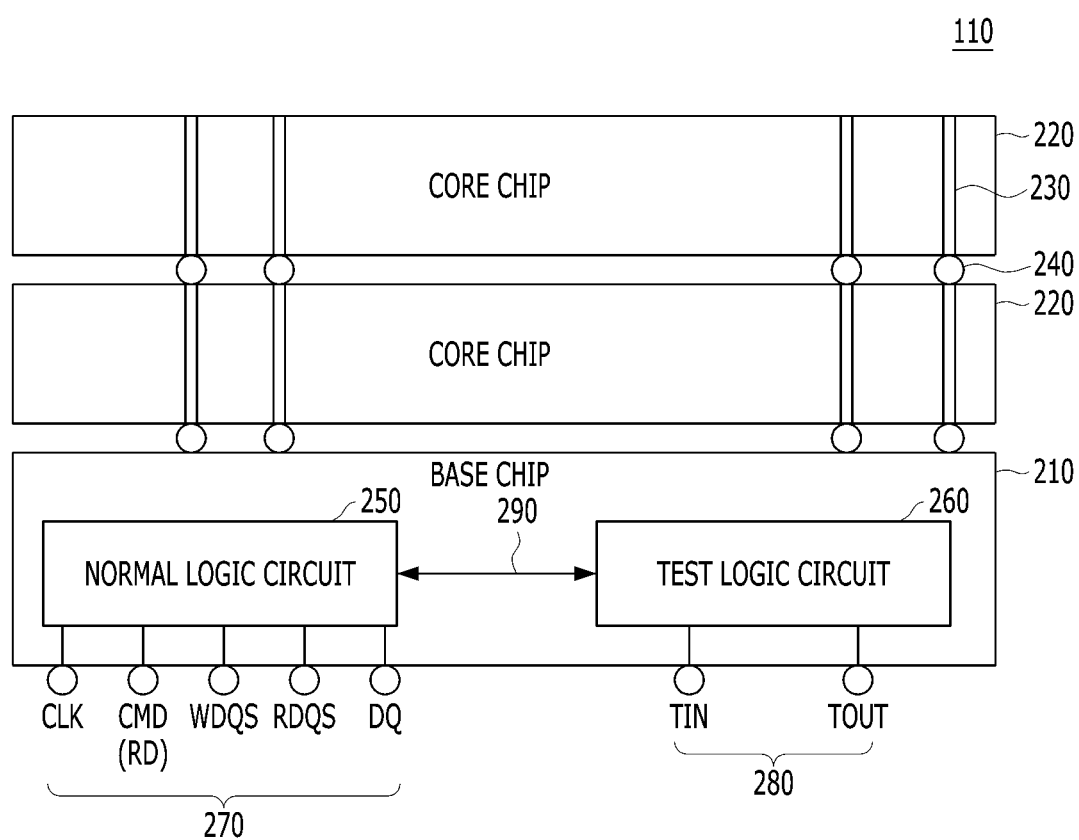
FIG. 2 is a diagram illustrating a memory device illustrated in FIG. 1 in accordance with various embodiments of the present invention.

FIG. 2 is a diagram illustrating the memory device 110 illustrated in FIG. 1 in accordance with various embodiments of the present invention. As illustrated in FIG. 2, the memory device 110 may include a base chip 210 and a plurality of core chips 220 stacked on the base chip 210.

The base chip 210 and the core chips 220 may be electrically connected to each other through through-silicon vias (TSVs) vertically penetrating the inside of the core chips 220, that is, through electrodes 230 and micro bumps 240, and may transmit/receive signals.

In the core chips 220, a data storage space, such as a memory cell array for storing data and a memory register, may be disposed. On the other hand, in the base chip 210, circuits for transmitting data between the core chips 220 and the controller 120 of FIG. 1 may be disposed. When the memory device 110 is configured in such a form, the number of input/output units may be greatly increased, which may be advantageous in increasing a bandwidth. An example of the memory device 110 configured in such a form may include a high bandwidth memory (HBM).

The base chip 210 in accordance with an embodiment may include a normal logic circuit 250 and a test logic circuit 260. The normal logic circuit 250 may include a circuit for controlling normal operations such as a write operation, a read operation, and a refresh operation of the memory device 110. The test logic circuit 260 may include a circuit for testing the memory device 110. The test logic circuit 260 may include various test operation-related circuits such as a built-in self-test circuit, a self-repair circuit, and a self-stress circuit.

The base chip 210 may further include a plurality of normal ports 270 and a plurality of test ports 280. The base chip 210 may transmit/receive various control signals required for the normal operations of the memory device 110 to/from the controller 120 through the plurality of normal ports 270. For example, the normal logic circuit 250 may transmit/receive a clock signal CLK, a command CMD, data strobe signals WDQS and RDQS, data DQ and the like through the plurality of normal ports 270.

The plurality of test ports 280 may be accessed directly and/or independently by another external device, such as a test equipment, regardless of the controller 120, and may receive various control signals TIN required for a test operation from the external device. The test logic circuit 260 may allow the memory device 110 to perform the test operation based on the control signals TIN received through the plurality of test ports 280. The test logic circuit 260 may output a test operation result signal TOUT of the memory device 110 through at least one test port 280.

The test logic circuit 260 may generate signals, which are required for the test operation of the memory device 110, based on the control signals TIN received through the plurality of test ports 280, and transmit the generated signals to the normal logic circuit 250 through a test path 290. By so doing, the test logic circuit 260 may operate the normal logic circuit 250, and the memory device 110 may perform the test operation without the control of the controller 120. The test logic circuit 260 may receive a test operation result from the normal logic circuit 250 through the test path 290, and output the test operation result signal TOUT through the test port 280.

The plurality of normal ports 270 may include micro bump pads. The memory device 110 may communicate with the controller 120 through the plurality of normal ports 270. That is, the plurality of normal ports 270 may be connected to the controller 120 through the signal path formed in the interposer 130 of FIG. 1.

On the other hand, the plurality of test ports 280 may include a direct access pad. The memory device 110 may directly or independently communicate with the test equipment through the plurality of test ports 280.

Figure 3:
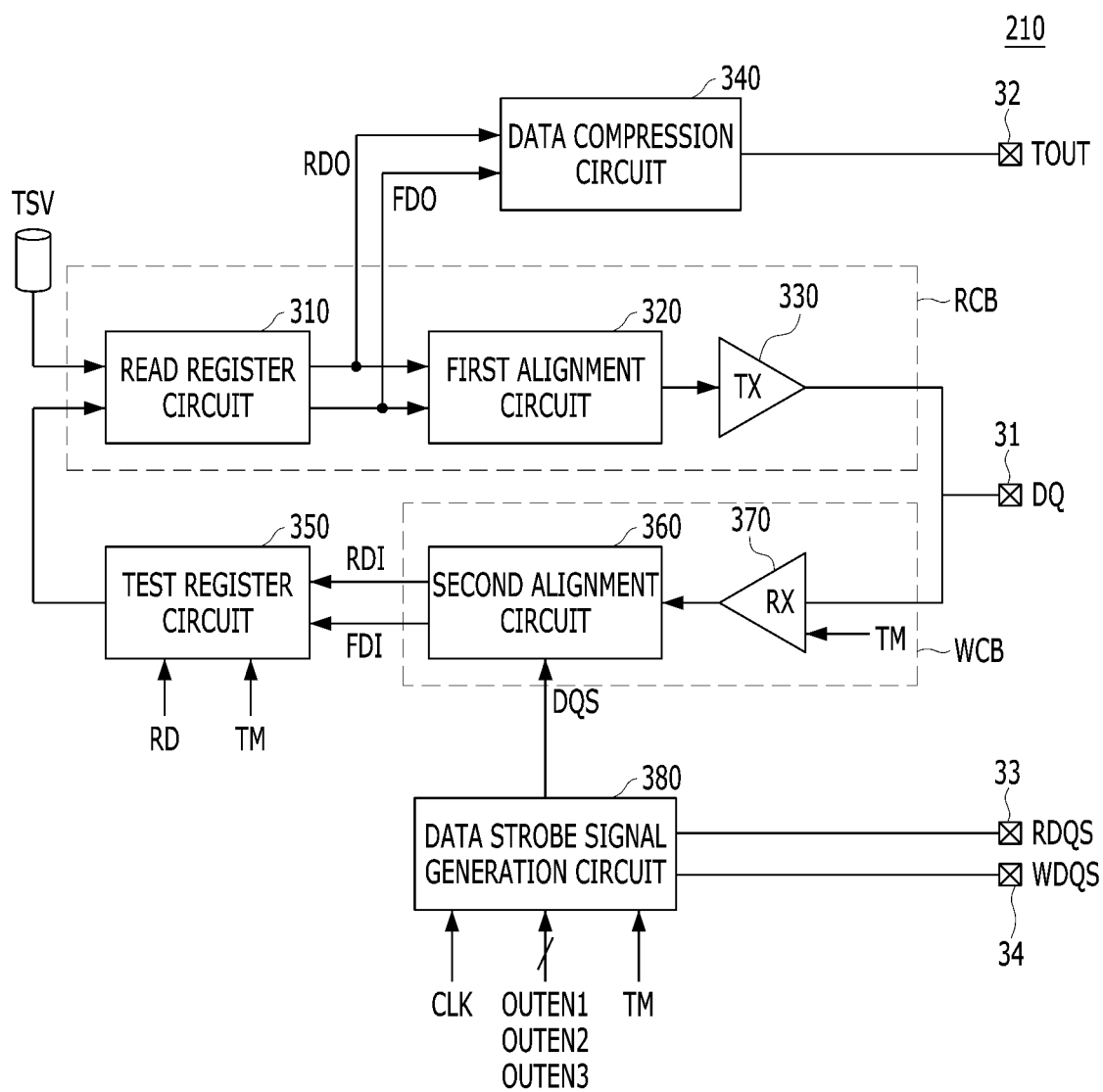
FIG. 3 is a diagram illustrating a base chip illustrated in FIG. 2 in accordance with various embodiments of the present invention.

FIG. 3 is a diagram illustrating the base chip 210 illustrated in FIG. 2 in accordance with various embodiments of the present invention. As described in FIG. 2, the base chip 210 may be electrically connected to the core chips 220 through the through electrodes (TSVs).

During a read operation, the base chip 210 may receive read data of the core chips 220 through the through electrodes (TSVs). The base chip 210 may include a read control block RCB on a read path and output the data received from the core chips 220 to a data pad 31. The read control block RCB may include a read register circuit 310, a first alignment circuit 320, and an output circuit 330.

The read register circuit 310 may store the read data outputted from the core chips 220 during the read operation. The read register circuit 310 may output the stored data as parallel data RD0 and FD0. The first alignment circuit 320 may serialize the parallel data RD0 and FD0, which are outputted from the read register circuit 310, based on the clock signal CLK. The first alignment circuit 320 may transmit the serialized data to the output circuit 330. The output circuit 330 may output the serialized data through the data pad 31 as read data DQ.

The base chip 210 may include a data compression circuit 340 for the test operation. In the test operation, the data compression circuit 340 may compress the parallel data RD0 and FD0 outputted from the read register circuit 310 to generate the test operation result signal TOUT. The data compression circuit 340 may output the test operation result signal TOUT to the outside through a test pad 32.

As described above, unlike the data pad 31, the test pad 32 may include pins or balls directly accessible by the external test equipment. Furthermore, since data compressed by the data compression circuit 340 is outputted, the test pad 32 may include a relatively smaller number of pins or balls than the data pad 31. By using the test pad 32, instead of the data pad 31, during the test operation, it is possible to improve test operation efficiency of the memory device 110.

However, when the test pad 32 is used during the test operation, defects of some circuits on the read path of the memory device 110, for example, the first alignment circuit 320 and the output circuit 330, may not be detected through the test operation. In addition, in order to match a speed of the test operation using the test pad 32 with a predetermined criterion, the position of an input terminal of the data compression circuit 340 may be limited on the read path.

In accordance with an embodiment of the present invention, the base chip 210 may include a test register circuit 350, a write control block WCB, and a data strobe signal generation circuit 380. The write control block WCB may include a second alignment circuit 360 and an input circuit 370 on a write path of the base chip 210.

During a write operation, the controller 120 of FIG. 1 may transmit write data DQ to the memory device 110. The input circuit 370 may receive the write data DQ transmitted from the controller 120 through the data pad 31. The second alignment circuit 360 may align data outputted from the input circuit 370, in parallel, based on an internal data strobe signal DQS. Data RDI and FDI aligned by the second alignment circuit 360 may be transmitted to the core chips 220 through the through electrodes (TSVs) via a write register circuit (not illustrated). That is, the write control block WCB on the write path may be used during a normal write operation, and a detailed description thereof will be omitted.

In accordance with an embodiment, during a test read operation, the test register circuit 350 may output data stored therein to the read path of the base chip 210, that is, the read control block RCB. When a test mode signal TM is activated and a read command RD is inputted, the test register circuit 350 may transmit initial data to the read register circuit 310.

In such a case, the read register circuit 310, the first alignment circuit 320, and the output circuit 330 included in the read control block RCB may perform the read operation according to the read command RD. That is, data outputted from the read register circuit 310 may be transmitted to the data pad 31 via the read control block RCB.

During the test read operation, the write control block WCB may feed back the data, which is outputted from the read control block RCB to the test register circuit 350. That is, when the test mode signal TM is activated during the test read operation, the input circuit 370 may be activated to feed the data DQ, which has been outputted to the data pad 31, back to the second alignment circuit 360.

The second alignment circuit 360 may align the data fed back by the input circuit 370, based on the internal data strobe signal DQS, and transmit the aligned data RDI and FDI to the test register circuit 350. As a consequence, the initial data stored in the test register circuit 350 may be transmitted to the data pad 31 via the read path according to the test read operation, and may be fed back again to the test register circuit 350.

The test register circuit 350 may have a storage space for storing data, and include a multiple input signature register (MISR). The test register circuit 350 may perform a preset operation on an inputted signal and store data obtained through the operation. Alternatively, the test register circuit 350 may compare an actual result of the preset operation performed on the inputted signal and a predetermined estimate to determine whether the test read operation result is a pass or a fail, and store the determination. Although not illustrated in FIG. 3, the test register circuit 350 may output the stored data to the outside through the test pad 32.

The base chip 210 may further include first and second data strobe pads 33 and 34. During the read operation, the data strobe signal generation circuit 380 may generate the read data strobe signal RDQS in response to the clock signal CLK, and first to third output control signals OUTEN1 to OUTEN3 derived from the read command RD. The read data strobe signal RDQS may indicate information on an output time point of data and may be transmitted to the controller 120 through the first data strobe pad 33.

During the write operation, the data strobe signal generation circuit 380 may receive the write data strobe signal WDQS through the second data strobe pad 34. The data strobe signal generation circuit 380 may generate the internal data strobe signal DQS based on the write data strobe signal WDQS.

In accordance with an embodiment, during the test read operation, the data strobe signal generation circuit 380 may generate the read data strobe signal RDQS and output the generated read data strobe signal RDQS to the first data strobe pad 33. Furthermore, the data strobe signal generation circuit 380 may generate the internal data strobe signal DQS based on the generated read data strobe signal RDQS. The data strobe signal generation circuit 380 will be described in more detail with reference to FIG. 4.

Figure 4:
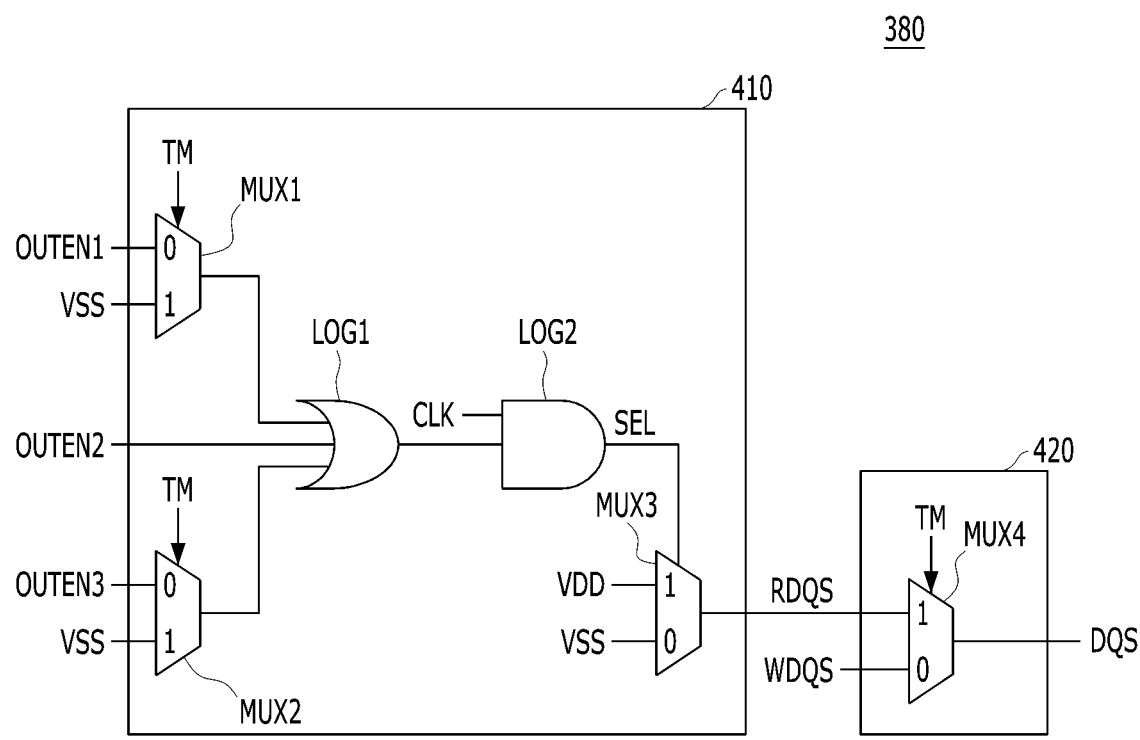
FIG. 4 is a diagram illustrating a data strobe signal generation circuit illustrated in FIG. 3 in accordance with various embodiments of the present invention.

FIG. 4 is a diagram illustrating the data strobe signal generation circuit 380 illustrated in FIG. 3 in accordance with various embodiments of the present invention. The data strobe signal generation circuit 380 may include a read data strobe signal generation unit 410 and a selection unit 420.

The read data strobe signal generation unit 410 may generate the read data strobe signal RDQS based on the first to third output control signals OUTEN1 to OUTEN3 in response to the test mode signal TM. The read data strobe signal generation unit 410 may include first to third multiplexers MUX1 to MUX3 and first and second logic gates LOG1 and LOG2.

The base chip 210 of FIG. 2 may include a decoding circuit (not illustrated) that decodes the inputted command CMD. For example, when the read command RD is inputted, the decoding circuit may decode the read command RD based on the clock signal CLK to generate an output enable signal OUTEN. An input time point of the read command RD may be identified based on the clock signal CLK, and after a time corresponding to a read latency from the identified input time point has elapsed, the output enable signal OUTEN may be activated. The output enable signal OUTEN may be a signal indicating an output timing of data according to a read operation. The output enable signal OUTEN may be shifted to generate the plurality of output control signals OUTEN1 to OUTEN3, and each of the plurality of output control signals OUTEN1 to OUTEN3 may be used to control circuits on the read path of the base chip 210. An operation of the read data strobe signal generation unit 410 according to the first to third output control signals OUTEN1 to OUTEN3 will be described in more detail with reference to FIG. 5.

The selection unit 420 may select one of the read data strobe signal RDQS and the write data strobe signal WDQS in response to the test mode signal TM, and output the selected signal as the internal data strobe signal DQS. The selection unit 420 may include a fourth multiplexer MUX4. When the test mode signal TM is activated, the selection unit 420 may output the read data strobe signal RDQS as the internal data strobe signal DQS, and when the test mode signal TM is deactivated, the selection unit 420 may output the write data strobe signal WDQS as the internal data strobe signal DQS.

Figure 5A:
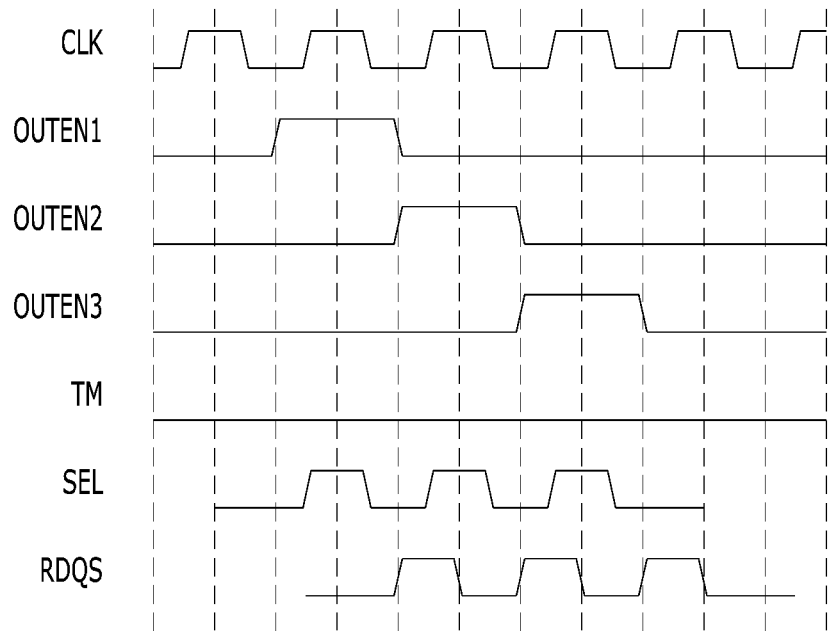
FIG. 5A and FIG. 5B are signal waveform diagrams for describing an operation of a read data strobe signal generation unit illustrated in FIG. 4 in accordance with various embodiments of the present invention.
Figure 5B:
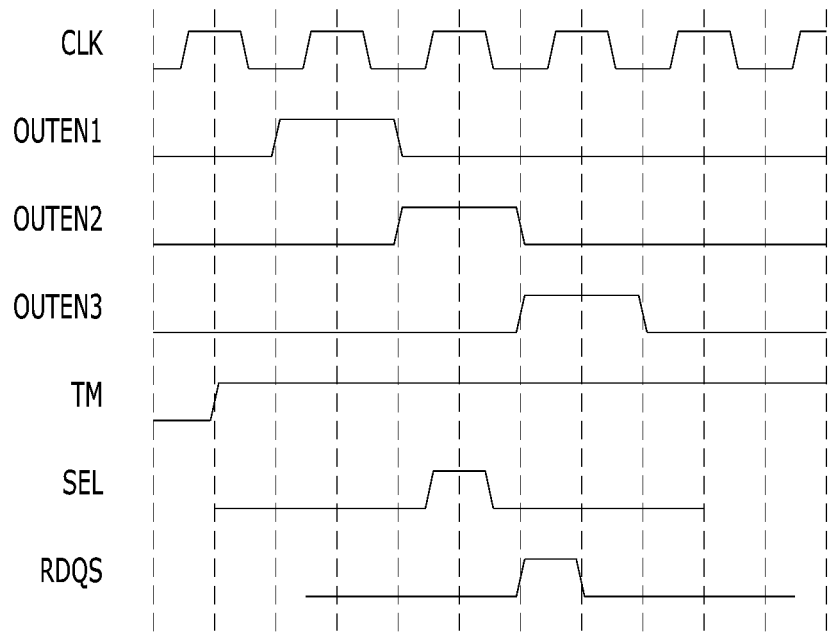

FIG. 5A and FIG. 5B are signal waveform diagrams for describing an operation of the read data strobe signal generation unit 410 illustrated in FIG. 4 in accordance with various embodiments of the present invention. FIG. 5A is a signal waveform diagram in which the read data strobe signal RDQS is generated during a normal read operation, and FIG. 5B is a signal waveform diagram in which the read data strobe signal RDQS is generated during the test read operation.

Referring to FIG. 5A, as the read command RD is inputted, the first to third output control signals OUTEN1 to OUTEN3 may be generated. Among the first to third output control signals OUTEN1 to OUTEN3, the second output control signal OUTEN2 may be activated at a time point corresponding to a read latency from the input of the read command RD. The first and third output control signals OUTEN1 and OUTEN3 may be generated by advancing or delaying the second output control signal OUTEN2 by a predetermined or set time.

When the test mode signal TM is deactivated during the normal read operation, the first and second multiplexers MUX1 and MUX2 of FIG. 4 may select and transmit the first and third output control signals OUTEN1 and OUTEN3, respectively. Accordingly, even though one of the first to third output control signals OUTEN1 to OUTEN3 is at a logic high level, the first logic gate LOG1 may activate its output signal to a logic high level.

The second logic gate LOG2 may combine the output signal of the first logic gate LOG1 and the clock signal CLK to generate a selection signal SEL. Accordingly, the selection signal SEL may be activated to a logic high level in response to the first to third output control signals OUTEN1 to OUTEN3. The third multiplexer MUX3 may alternately output a power supply voltage VDD and a ground voltage VSS when the selection signal SEL is in a high level period and in a low level period, thereby generating the read data strobe signal RDQS.

As a consequence, the read data strobe signal RDQS may have a waveform having three (3) activation periods, that is, an activation period corresponding to an output time point of data, an activation period corresponding to a time point preceding the output time point of data by a predetermined time, i.e., a pre-amble, and an activation period corresponding to a time point following the output time point of data by the predetermined time, i.e., a post-amble. When the read data strobe signal RDQS having such a waveform is used, it is possible to secure a sufficient data margin in a device which receives data.

Referring to FIG. 5B, during the test read operation in accordance with various embodiments of the present invention, the read data strobe signal generation unit 410 may generate the read data strobe signal RDQS in response to only an output time point of data. When the test mode signal TM is activated during the test read operation, the first and second multiplexers MUX1 and MUX2 may block the first and third output control signals OUTEN1 and OUTEN3, respectively, and transmit an output signal having a level of the ground voltage VSS. Accordingly, when the second output control signal OUTEN2 of the first to third output control signals OUTEN1 to OUTEN3 is at a logic high level, the first logic gate LOG1 may activate its output signal to a logic high level.

As a consequence, the selection signal SEL may be activated to a logic high level in response to the second output control signal OUTEN2. The read data strobe signal RDQS may have a waveform that is activated only at the output time point of data.

During the test read operation, the read data strobe signal RDQS may be selected as the internal data strobe signal DQS. The internal data strobe signal DQS may be used to align data fed back via the data pad 31 in parallel. Particularly, when the test register circuit 350 includes the MISR, the test read operation may be performed based on the internal data strobe signal DQS.

Accordingly, during the test read operation, the pre-amble and the post-amble may be removed when the read data strobe signal RDQS is generated, so that it is possible to estimate a result of the preset operation capable of being performed by the MISR. By comparing the estimate and an actual result of the preset operation performed by the MISR during the test read operation, it is possible to confirm defects of the read path and the write path according to whether the estimate matches with the actual result of the preset operation performed by the MISR.

Figure 6:
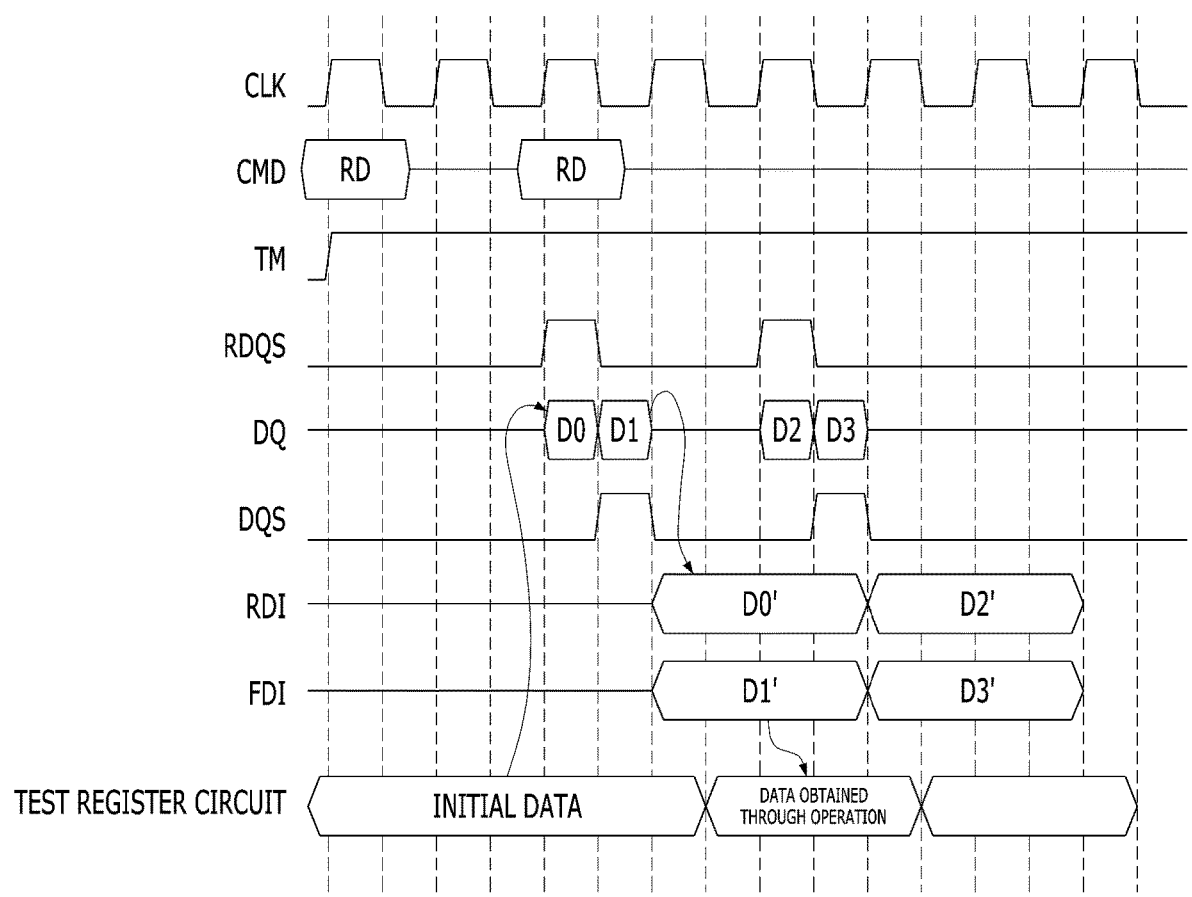
FIG. 6 is a signal waveform diagram for describing an operation of the memory device in accordance with various embodiments of the present invention.

FIG. 6 is a signal waveform diagram for describing an operation of the memory device in accordance with various embodiments of the present invention.

As the test mode signal TM is activated and the read command RD is inputted, the memory device may perform the test read operation. During the test read operation, the initial data stored in the test register circuit 350 of FIG. 3 may be outputted to the read control block RCB of FIG. 3. In response to the read command RD, the read control block RCB may perform the read operation and transmit data, which is outputted from the read register circuit 310, to the data pad 31 of FIG. 3 as read data D0 and D1.

During the test read operation, the data strobe signal generation circuit 380 of FIG. 3 may generate the read data strobe signal RDQS based on the test mode signal TM and the output control signals OUTEN1 to OUTEN3 derived from the read command RD. Furthermore, the data strobe signal generation circuit 380 may generate the internal data strobe signal DQS based on the generated read data strobe signal RDQS.

During the test read operation, the write control block WCB of FIG. 3 may feed back the read data D0 and D1 outputted to the data pad 31. The write control block WCB may align the fed-back data in parallel based on the internal data strobe signal DQS and transmit the aligned data D0' and D1' to the test register circuit 350. The test register circuit 350 may perform a preset operation on the aligned data D0' and D1' and store data obtained through the preset operation.

In the state in which the test mode signal TM has been activated, whenever the read command RD is inputted, data stored in the test register circuit 350 may be continuously outputted to the data pad 31 as read data D2 and D3, may be fed back again, and may be subjected to the preset operation. The test register circuit 350 may output data obtained through the preset operation to the test pad 32 of FIG. 3. Accordingly, it is possible to compare expected data obtained through the normal read operation and data obtained through the preset operation, and to test the circuits on the read/write paths of the memory device by using a limited number of test pads 32.

Hereinafter, a method for feeding back the read data strobe signal RDQS through the first data strobe pad 33, i.e., a read data strobe pad, and for monitoring a duty ratio of the fed-back read data strobe signal, will be described.

Figure 7:
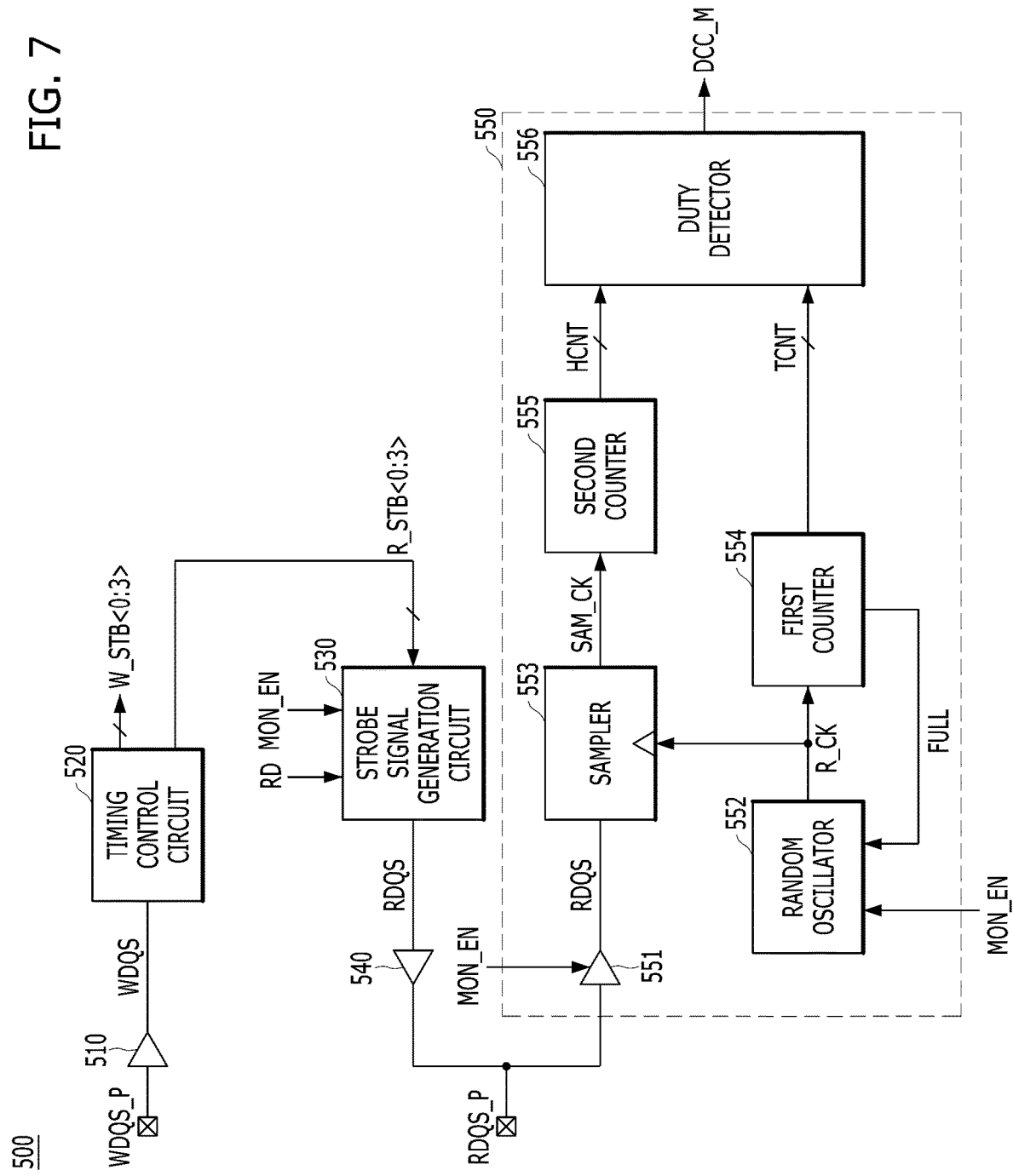
FIG. 7 is a diagram illustrating a semiconductor device including a monitoring circuit in accordance with an embodiment of the present invention.

FIG. 7 is a diagram illustrating a semiconductor device 500 including a monitoring circuit 550 in accordance with an embodiment of the present invention.

Referring to FIG. 7, the semiconductor device 500 may include a first data strobe pad RDQS_P, a second data strobe pad WDQS_P, a receiver 510, a timing control circuit 520, a strobe signal generation circuit 530, a transmitter 540, and the monitoring circuit 550.

The first data strobe pad RDQS_P may be provided to input/output a read data strobe signal RDQS, and the second data strobe pad WDQS_P may be provided to input/output a write data strobe signal WDQS. Depending on an embodiment, in case where the semiconductor device 500 is a stacked semiconductor device, a plurality of data pads DQ, the first data strobe pad RDQS_P and the second data strobe pad WDQS_P may be disposed in the base chip 210, as describe in FIG. 2. Further, at least one core chip 220 may be stacked over the base chip 210, and may be electrically connected to the base chip 210 through through-silicon vias (TSVs) vertically penetrating the inside thereof.

The receiver 510 may receive the write data strobe signal WDQS inputted through the second data strobe pad WDQS_P. For reference, in a recent stacked semiconductor device, a clock signal of a predetermined period may be provided through a write data strobe pad even during a read operation. Thus, the receiver 510 may receive the write data strobe signal WDQS inputted through the second data strobe pad WDQS_P from the controller 120 during a normal operation such as a write operation and the read operation.

The timing control circuit 520 may generate a write timing signal W_STB<0:3> and a read timing signal R_STB<0:3>, to the write data strobe signal WDQS inputted through the second data strobe pad WDQS_P. For example, the timing control circuit 520 may generate 4-phase internal clocks by dividing a frequency of the write data strobe signal WDQS, and delay the 4-phase internal clocks by a certain delay amount to generate the write timing signal W_STB<0:3> and the read timing signal R_STB<0:3>. Depending on an embodiment, the timing control circuit 520 may output the write timing signal W_STB<0:3> and the read timing signal R_STB<0:3> by eliminating pre-amble and/or post-amble of the 4-phase internal clocks, according to an output control signal. In particular, since the receiver 510 may receive the write data strobe signal WDQS during the read operation, the timing control circuit 520 may generate the read timing signal R_STB<0:3> during the read operation according to the write data strobe signal WDQS.

The strobe signal generation circuit 530 may generate the read data strobe signal RDQS based on the read timing signal R_STB<0:3>. For example, the strobe signal generation circuit 530 may generate the read data strobe signal RDQS which is enabled in synchronization with a first bit R_STB<0>, disabled in synchronization with a second bit R_STB<1>, enabled in synchronization with a third bit R_STB<2>, and disabled in synchronization with a fourth bit R_STB<3>. The strobe signal generation circuit 530 may be activated according to a read command RD inputted for the read operation, or a monitoring enable signal MON_EN enabled for a monitoring operation. That is, the strobe signal generation circuit 530 may generate the read data strobe signal RDQS based on the read timing signal R_STB<0:3> during the read operation or the monitoring operation.

The transmitter 540 may output the read data strobe signal RDQS to the first data strobe pad RDQS_P.

The monitoring circuit 550 may generate a sampling clock SAM_CK by sampling, according to a random clock R_CK, the read data strobe signal RDQS fed back through the first data strobe pad RDQS_P during the monitoring operation. The monitoring circuit 550 may generate a first counting signal TCNT and a second counting signal HCNT by respectively counting the random clock R_CK and the sampling clock SAM_CK. The monitoring circuit 550 may generate a duty ratio detection signal DCC_M indicating a duty ratio of the read data strobe signal RDQS, based on the first counting signal TCNT and the second counting signal HCNT.

Though it is not shown, the monitoring circuit 550 may provide the duty ratio detection signal DCC_M to a duty cycle correction (DCC) circuit disposed in the semiconductor device 500. The DCC circuit may correct duty ratios of internal signals, according to the duty ratio detection signal DCC_M. Depending on an embodiment, the monitoring circuit 550 may store the duty ratio detection signal DCC_M in a mode register set (MRS) circuit disposed in the semiconductor device 500, and output a stored value to an external device (e.g., the controller 120) according to a mode register read command MRR. The controller 120 may precisely control duty ratios of signals provided to the semiconductor device 500, based on the stored value.

In detail, the monitoring circuit 550 may include a monitoring receiver 551, a random oscillator 552, a sampler 553, a first counter 554, a second counter 555, and a duty detector 556. The monitoring receiver 551, the random oscillator 552, the sampler 553, the first counter 554, the second counter 555, and the duty detector 556 may include all circuits, systems, software, firmware and devices necessary for their respective operations and functions.

The monitoring receiver 551 may receive the read data strobe signal RDQS according to the monitoring enable signal MON_EN. The monitoring receiver 551 may receive, when the monitoring enable signal MON_EN is enabled, the read data strobe signal RDQS fed back through the first data strobe pad RDQS_P.

The random oscillator 552 may generate, according to the monitoring enable signal MON_EN, the random clock R_CK having a random period. The random oscillator 552 may be deactivated according to a full-counting signal FULL. That is, the random oscillator 552 may generate the random clock R_CK, which is randomly toggling, when the full-counting signal FULL is disabled and the monitoring enable signal MON_EN is enabled. On the contrary, the random oscillator 552 may stop the toggling of the random clock R_CK when the full-counting signal FULL is enabled or the monitoring enable signal MON_EN is disabled.

The sampler 553 may generate the sampling clock SAM_CK by sampling the fed back read data strobe signal RDQS according to the random clock R_CK. The sampler 553 may latch the read data strobe signal RDQS at a rising edge of the random clock R_CK, and output the sampling clock SAM_CK by filtering a latched signal according to the random clock R_CK. The sampler 553 may generate the sampling clock SAM_CK that is enabled when the read data strobe signal RDQS becomes a high level at the rising edge of the random clock R_CK and that is disabled at a falling edge of the random clock R_CK. A detailed configuration and operation of the sampler 553 will be described in FIGS. 9A and 9B.

The first counter 554 may generate the first counting signal TCNT by counting the random clock R_CK. The first counter 554 may generate the first counting signal TCNT by counting every rising edge of the random clock R_CK. The first counter 554 may enable the full-counting signal FULL when the first counting signal TCNT is fully counted to reach a maximum. For example, when the first counting signal TCNT is composed of 4-bit counter, the first counter 554 may enable the full-counting signal FULL when the first counting signal TCNT reaches "1111".

The second counter 555 may generate the second counting signal HCNT by counting the sampling clock SAM_CK. The second counter 555 may generate the second counting signal HCNT by counting every rising edge of the sampling clock SAM_CK. For example, the second counting signal HCNT may be composed of the same bit number as the first counting signal TCNT.

Figure 8:
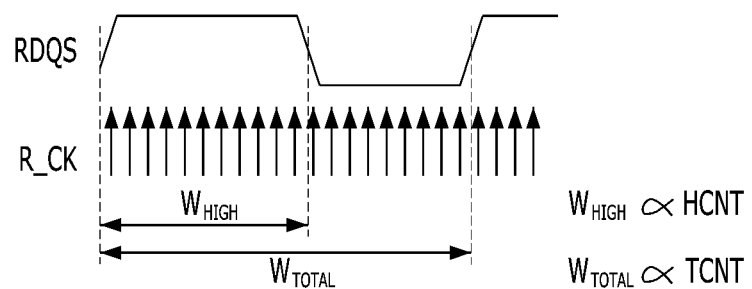
FIG. 8 is a waveform diagram for describing a monitoring operation in accordance with an embodiment of the present invention.

The duty detector 556 may generate the duty ratio detection signal DCC_M, based on the first counting signal TCNT and the second counting signal HCNT. For reference, referring to FIG. 8, the second counting signal HCNT may represent a number of the rising edges of the random clock R_CK during a high section of the read data strobe signal RDQS. That is, the second counting signal HCNT may be proportional to a width of the high section $W_{HIGH}$ of the read data strobe signal RDQS. On the contrary, the first counting signal TCNT may represent a number of all rising edges of the random clock R_CK regardless of a level of the read data strobe signal RDQS. That is, the first counting signal TCNT may be proportional to a width of a total section $W_{TOTAL}$ of the read data strobe signal RDQS. The duty detector 556 may generate the duty ratio detection signal DCC_M by calculating a ratio (HIGH RATIO) of a high section to a total section, and a ratio (LOW RATIO) of a low section to the total section, based on a following equation.

$$\text{LOW RATIO: } \frac{TCNT - HCNT}{TCNT} \qquad \text{[EQUATION 1]}$$
$$\text{HIGH RATIO: } \frac{HCNT}{TCNT}$$

Figure 9A:
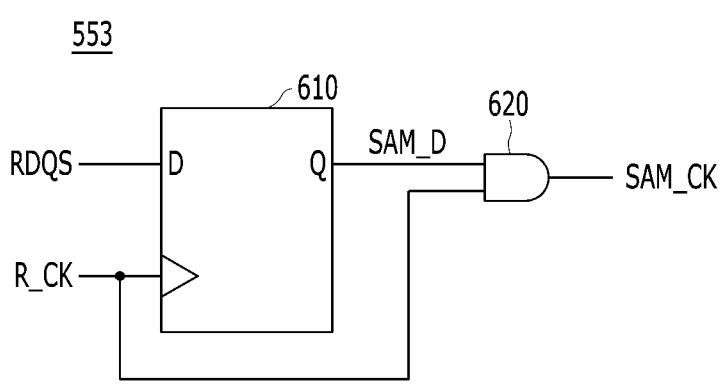
FIG. 9A is a circuit diagram illustrating a sampler of FIG. 7 in accordance with an embodiment of the present invention.
Figure 9B:
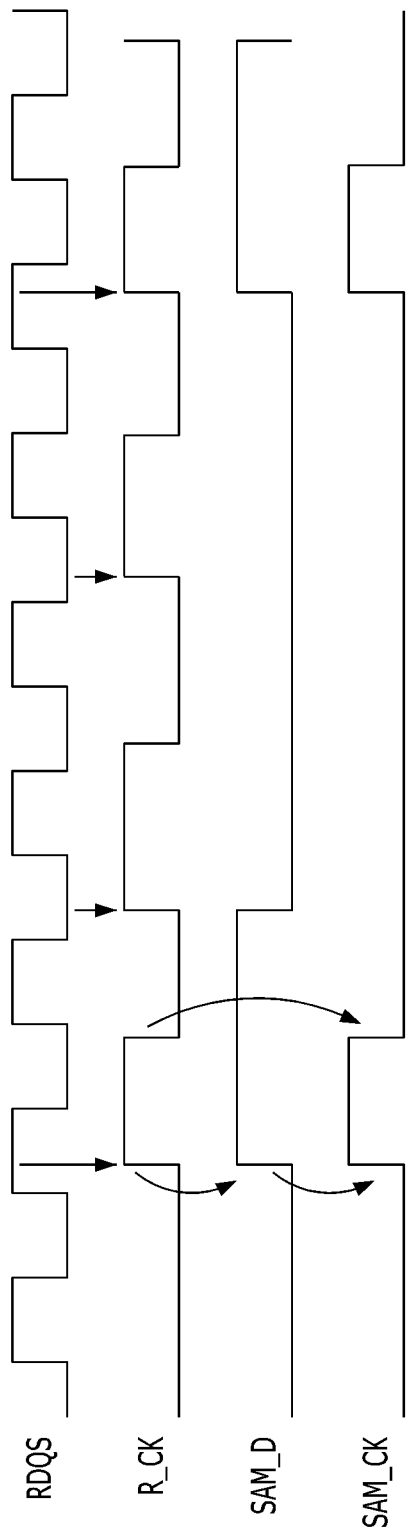
FIG. 9B is a waveform diagram for describing an operation of the sampler of FIG. 9A in accordance with an embodiment of the present invention.

FIG. 9A is a circuit diagram illustrating the sampler 553 of FIG. 7 in accordance with an embodiment of the present invention. FIG. 9B is a waveform diagram for describing an operation of the sampler 553 of FIG. 9A in accordance with an embodiment of the present invention.

Referring to FIG. 9A, the sampler 553 may include a flip-flop 610 and a filter 620.

The flip-flop 610 may latch the read data strobe signal RDQS at a rising edge of the random clock R_CK to output a pre-sampling clock SAM_D. The flip-flop 610 may be implemented with a D-flip-flop that receives the random clock R_CK as a clock signal, receives the read data strobe signal RDQS as an input signal, and outputs the pre-sampling clock SAM_D as an output signal.

The filter 620 may filter the pre-sampling clock SAM_D according to the random clock R_CK to output the sampling clock SAM_CK. The filter 620 may output the pre-sampling clock SAM_D as the sampling clock SAM_CK during a high section of the random clock R_CK, and output the sampling clock SAM_CK of a low level during a low section of the random clock R_CK. The filter 620 may be implemented with a logic AND gate for performing an AND operation on the pre-sampling clock SAM_D and the random clock R_CK.

Referring to FIG. 9B, the flip-flop 610 may latch the read data strobe signal RDQS at every rising edge of the random clock R_CK to output the pre-sampling clock SAM_D. The filter 620 may output the pre-sampling clock SAM_D as the sampling clock SAM_CK during the high section of the random clock R_CK.

As described above, the sampler 553 may generate the sampling clock SAM_CK that is enabled when the read data strobe signal RDQS becomes a high level at the rising edge of the random clock R_CK, and that is disabled at a falling edge of the random clock R_CK.

Thereafter, the second counter 555 may generate the second counting signal HCNT of "0010" by counting every rising edge of the sampling clock SAM_CK. The first counter 554 may generate the first counting signal TCNT of "0100" by counting every rising edge of the random clock R_CK. The duty detector 556 may generate the duty ratio detection signal DCC_M based on the first counting signal TCNT and the second counting signal HCNT. For example, the second counter 555 may calculate the ratio (HIGH RATIO) to be 1/2, and the ratio (LOW RATIO) to be 1/2, to thereby generate the duty ratio detection signal DCC_M corresponding to the calculated ratios.

As described above, in accordance with an embodiment of the present invention, through the monitoring circuit 550, the semiconductor device 500 may receive the read data strobe signal RDQS, which is fed-back through the read data strobe pad RDQS_P, and monitor the duty ratio of the fed-back read data strobe signal RDQS. Thus, it is possible to improve the signal integrity (SI) of the read data strobe signal RDQS, ensuring a high-speed operation between the semiconductor device 500 and the controller 120.

Moreover, the semiconductor device such as a high bandwidth memory (HBM) may include a multiple input signature register (MISR) circuit for testing, training or verifying an interface/link with a host or a controller. Hereinafter, using the MISR circuit as the second counter, a method for monitoring a duty ratio of the fed-back read data strobe signal RDQS will be described.

Figure 10:
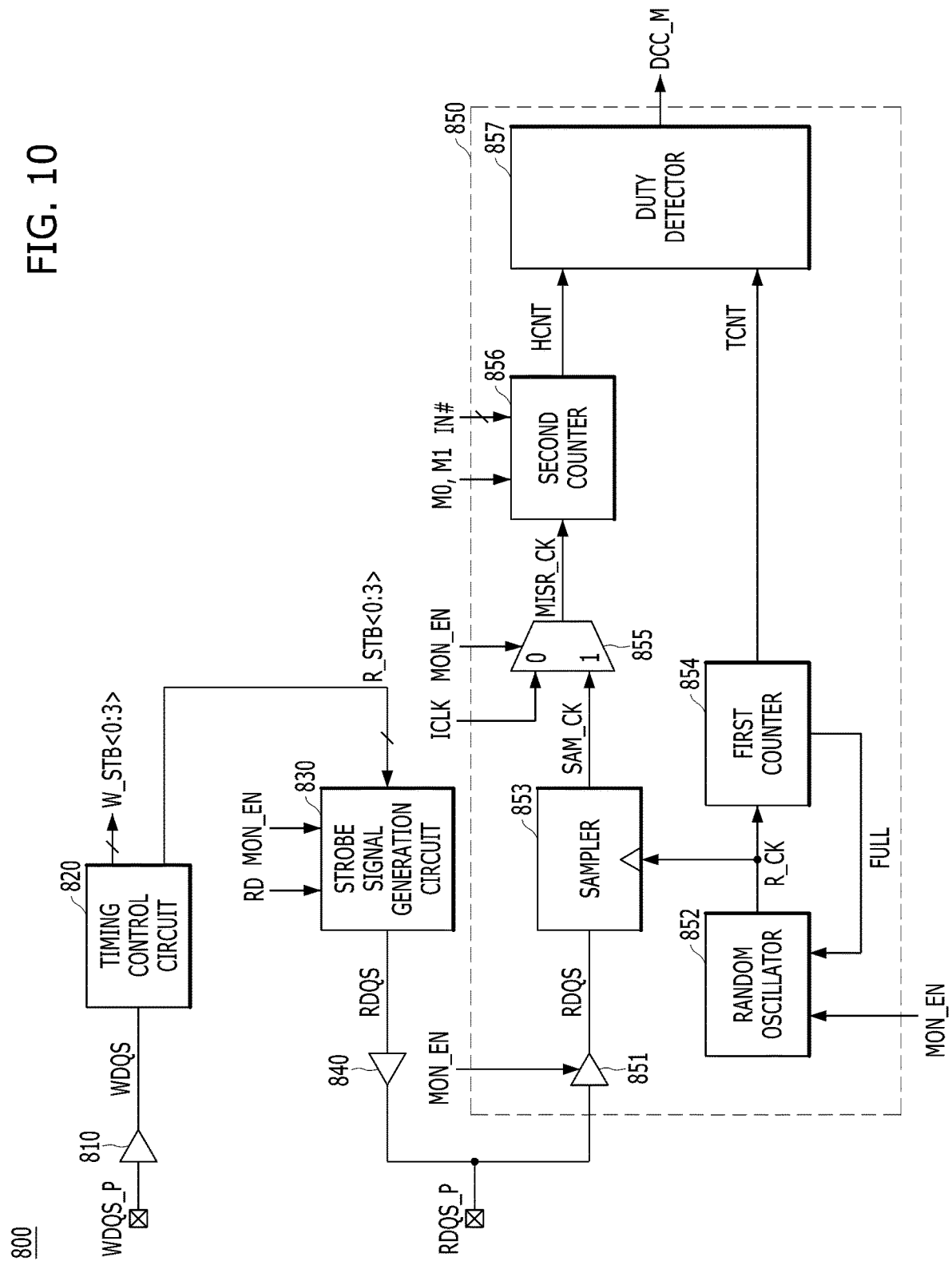
FIG. 10 is a diagram illustrating a semiconductor device including a monitoring circuit in accordance with an embodiment of the present invention.
Figure 11A:
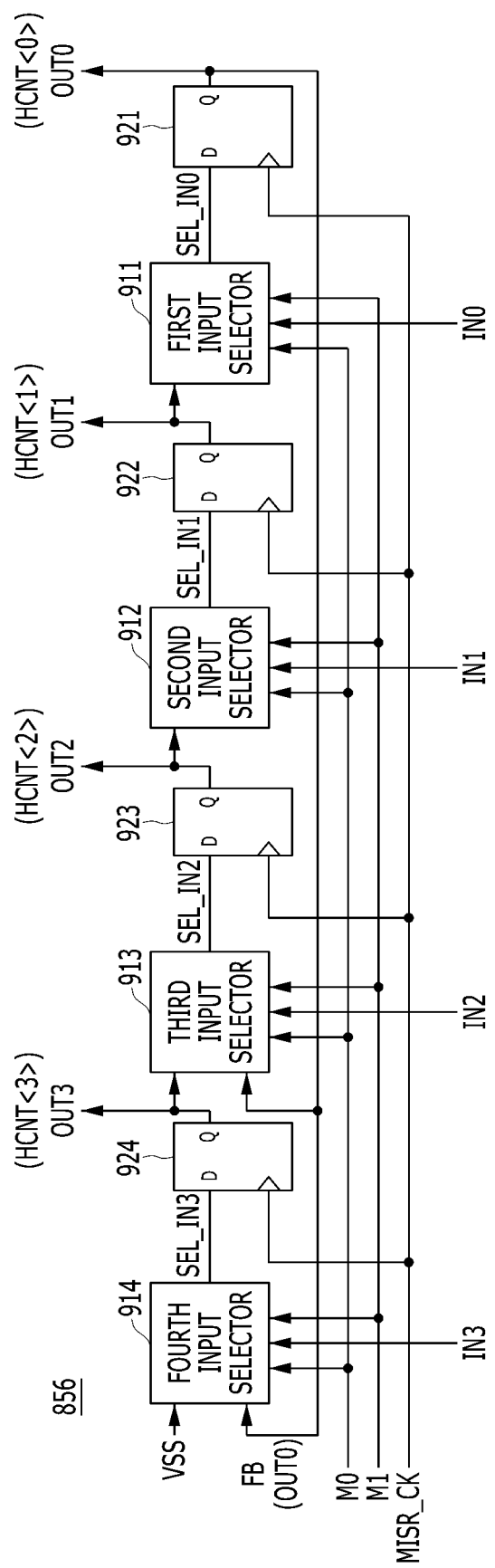
FIG. 11A is a circuit diagram illustrating a second counter of FIG. 10 in accordance with an embodiment of the present invention.

FIG. 10 is a diagram illustrating a semiconductor device 800 including a monitoring circuit 850 in accordance with an embodiment of the present invention. FIG. 11A is a circuit diagram illustrating a second counter 856 of FIG. 10 in accordance with an embodiment of the present invention. FIG. 11B is a table for describing an operation of the second counter 856 of FIG. 11A in accordance with an embodiment of the present invention.

Referring to FIG. 10, the semiconductor device 800 may include a first data strobe pad RDQS_P, a second data strobe pad WDQS_P, a receiver 810, a timing control circuit 820, a strobe signal generation circuit 830, a transmitter 840, and the monitoring circuit 850.

The first data strobe pad RDQS_P, the second data strobe pad WDQS_P, the receiver 810, the timing control circuit 820, the strobe signal generation circuit 830, and the transmitter 840 may have substantially the same configurations and operations as those of FIG. 7.

The monitoring circuit 850 may include a monitoring receiver 851, a random oscillator 852, a sampler 853, a first counter 854, a multiplexer 855, a second counter 856, and a duty detector 857. The monitoring receiver 851, the random oscillator 852, the sampler 853, the first counter 854 and the duty detector 857 may have substantially the same configurations and operations as those of FIG. 7.

The multiplexer 855 may output an operational clock MISR_CK by selecting one of an internal clock and a sampling clock SAM_CK according to the monitoring mode signal MON_EN. The multiplexer 855 may output the operational clock MISR_CK by selecting the sampling clock SAM_CK during the monitoring operation when the monitoring mode signal MON_EN is enabled.

The second counter 856 may generate a second counting signal HCNT by counting the operational clock MISR_CK. The second counter 856 may generate the second counting signal HCNT by counting every rising edge of the operational clock MISR_CK. In particular, the second counter 856 may include a MISR circuit for performing the function of a linear feedback shift register (LFSR) according to the operational clock MISR_CK. In a case where the second counter 856 is implemented with the MISR circuit, the second counter 856 may operate according to first and second input control signals M0 and M1, and a plurality of external input signals IN #, where # is an integer greater than or equal to 2.

Referring to FIG. 11A, a case where the second counter 856 is implemented with the MISR circuit is shown.

The MISR circuit may include a plurality of input selectors and a plurality of flip-flops, which are alternatively coupled in series with one another. The plurality of input selectors may respectively correspond to the plurality of flip-flops. For example, the MISR circuit includes first to fourth input selectors 911 to 914, and first to fourth flip-flops 921 to 924 to store and output 4 bits. First to fourth output signals OUT0 to OUT3 are outputted from the output terminals of the first to fourth flip-flops 921 to 924, respectively. The first output signal OUT0 is outputted last among the first to fourth output signals OUT0 to OUT3 and is provided as a feedback signal FB to the third input selector 913 and the fourth input selector 914. The first to fourth output signals OUT0 to OUT3 may be provided as each bit of the second counting signal HCNT.

The first to fourth input selectors 911 to 914 may output first to fourth selection signals SEL_IN0 to SEL_IN3, respectively. The first to fourth input selectors 911 to 914 may combine the first to fourth output signals OUT0 to OUT3 which are outputted from previous stage flip-flops, with the first to fourth external input signals IN0 to IN3, based on the first and second input control signals M0 and M1 and the feedback signal FB. For example, the third input selector 913 may output the third selection signal SEL_IN2 by combining the fourth output signal OUT3 outputted from the fourth flip-flop 924 and the third external input signal IN2, based on the first and second input control signals M0 and M1 and the feedback signal FB. The fourth input selector 914 is positioned at the foremost stage of the serial coupling. The fourth input selector 914 may receive a signal of the level of a ground voltage VSS as the output signal of a previous stage flip-flop. The first to fourth selection signals SEL_IN0 to SEL_IN3 may be provided as input signals of corresponding flip-flops.

The first to fourth flip-flops 921 to 924 may store the first to fourth selection signals SEL_IN0 to SEL_IN3 provided from corresponding input selectors, and output the values stored therein as the first to fourth output signals OUT0 to OUT3 in response to the operational clock MISR_CK. The first to fourth selection signals SEL_IN0 to SEL_IN3 may be provided from corresponding input selectors. The first to fourth output signals OUT0 to OUT3 of the first to fourth flip-flops 921 to 924 may be provided to next stage input selectors, respectively.

Moreover, the first to fourth output signals OUT0 to OUT3 and the first to fourth external input signals IN0 to IN3 may correspond one to one. Corresponding output signal and external input signal may share the same input/output pad (for example, a DQ pad) and may be inputted and outputted through the shared input/output pad.

Referring to FIG. 11B, an operation of the MISR circuit is described.

First, when the first input control signal M0 and the second input control signal M1 are a logic low level (e.g., '0'), the first to fourth input selectors 911 to 914 output all of the first to fourth selection signals SEL_IN0 to SEL_IN3 at logic low levels ('0'). Accordingly, the MISR circuit may perform a reset function When the first input control signal M0 is inputted at a logic high level (e.g., '1') and the second input control signal M1 is inputted at the logic low level ('0'), the first to fourth input selectors 911 to 914 output the output signals of the previous stage flip-flops as the first to fourth selection signals SEL_IN0 to SEL_IN3. Accordingly, the first to fourth flip-flops 921 to 924 may operate as shift registers which receive and output the output signals of the previous stage flip-flops based on the toggling of the operational clock MISR_CK. That is, the MISR circuit may perform the function of a linear feedback shift register (LFSR). The third input selector 913 may selectively invert the output signal of the previous stage flip-flop (that is, the fourth output signal OUT3) depending on the logic level of the feedback signal FB, and may output the third selection signal SEL_IN2. The fourth input selector 914 may selectively invert the output signal of the previous stage flip-flop (that is, the signal of the level of the ground voltage VSS) depending on the logic level of the feedback signal FB, and may output the fourth selection signal SEL_IN3.

When the first input control signal M0 is inputted at the logic low level ('0') and the second input control signal M1 is inputted at the logic high level ('1'), the first to fourth input selectors 911 to 914 provide the first to fourth selection signals SEL_IN0 to SEL_IN3 by selecting the first to fourth external input signals IN0 to IN3. The first to fourth flip-flops 921 to 924 may store the first to fourth selection signals SEL_IN0 to SEL_IN3 based on the toggling of the operational clock MISR_CK. The MISR circuit may perform a simple register function.

When the first input control signal M0 and the second input control signal M1 are inputted at the logic high level ('1'), the first to fourth input selectors 911 to 914 provide the first to fourth selection signals SEL_IN0 to SEL_IN3 by combining the first to fourth output signals OUT0 to OUT3 outputted from the previous stage flip-flops and the first to fourth external input signals IN0 to IN3 depending on the feedback signal FB. Accordingly, the MISR circuit may perform the function of a multiple-input shift register (MISR).

As described above, the MISR circuit may perform various functions depending on the logic levels of the first and second input control signals M0 and M1.

Referring back to FIG. 10, in accordance with an embodiment of the present invention, the second counter 856 may perform the counting operation as the MISR circuit supports the LFSR function in response to the first input control signal M0 at a logic high level (e.g., '1') and the second input control signal M1 at the logic low level ('0').

As described above, in accordance with an embodiment of the present invention, by utilizing the existing MISR circuit as the counting circuit, the semiconductor device 800 may monitor the duty ratio of the read data strobe signal RDQS while minimizing the increase in the area thereof.

Although various embodiments of the present invention have been described for illustrative purposes, it will be apparent to those skilled in the art that various changes and modifications may be made without departing from the spirit and scope of the invention as defined in the following claims. Furthermore, the embodiments may be combined to form additional embodiments.

What is claimed is:

1. A semiconductor device, comprising:
    a first data strobe pad;
    a strobe signal generation circuit suitable for generating a read data strobe signal based on a read timing signal;
    a monitoring receiver suitable for receiving the read data strobe signal which is fed back through the first data strobe pad according to a monitoring enable signal;
    a sampler suitable for generating a sampling clock by sampling the fed back read data strobe signal according to a random clock;
    a first counter suitable for generating a first counting signal by counting the random clock;
    a second counter suitable for generating a second counting signal by counting the sampling clock; and
    a duty detector suitable for generating a duty ratio detection signal based on the first counting signal and the second counting signal.

2. The semiconductor device of claim 1, further comprising:
    a second data strobe pad; and
    a timing control circuit suitable for generating the read timing signal according to a write data strobe signal inputted through the second data strobe pad during a read operation.

3. The semiconductor device of claim 2, further comprising:
    a base chip in which a plurality of data pads, the first data strobe pad, and the second data strobe pad are disposed; and
    at least one core chip stacked on the base chip and electrically connected to the base chip through a through electrode formed by vertically penetrating an inside of the core chip.

4. The semiconductor device of claim 1, further comprising a transmitter suitable for outputting the read data strobe signal which is generated by the strobe signal generation circuit, to the first data strobe pad.

5. The semiconductor device of claim 1,
    further comprising a random oscillator suitable for generating the random clock having a random period,
    wherein the random oscillator is activated according to the monitoring enable signal and deactivated according to a full-counting signal which is transferred from the first counter when the first counting signal is fully counted to reach a maximum.

6. The semiconductor device of claim 1, wherein the sampler includes:
    a flip-flop suitable for latching the fed back read data strobe signal at a rising edge of the random clock to output a pre-sampling clock; and
    a filter suitable for filtering the pre-sampling clock according to the random clock to output the sampling clock.

7. The semiconductor device of claim 1,
further comprising a multiplexer suitable for outputting, as an operational clock, one of an internal clock and the sampling clock according to the monitoring mode signal,
wherein the second counter includes a multiple input signature register (MISR) circuit for performing a function of a linear feedback shift register (LFSR) according to the operational clock.

8. A stacked semiconductor device, comprising:
a base chip including:
   a first data strobe pad,
   a strobe signal generation circuit suitable for generating a read data strobe signal based on a read timing signal, and
   a monitoring circuit suitable for:
      generating a sampling clock by sampling the read data strobe signal which is fed back through the first data strobe pad according to a random clock, and
      monitoring a duty ratio of the read data strobe signal based on first and second counting signals which are generated by respectively counting the random clock and the sampling clock during a monitoring operation; and
at least one core chip stacked over the base chip.

9. The stacked semiconductor device of claim 8, wherein the base chip includes:
a second data strobe pad; and
a timing control circuit suitable for generating the read timing signal according to a write data strobe signal inputted through the second data strobe pad during a read operation.

10. The stacked semiconductor device of claim 8, wherein the base chip includes a transmitter suitable for outputting the read data strobe signal which is generated by the strobe signal generation circuit, to the first data strobe pad.

11. The stacked semiconductor device of claim 8, wherein the monitoring circuit includes:
a monitoring receiver suitable for receiving the read data strobe signal which is fed back through the first data strobe pad, according to a monitoring enable signal;
a sampler suitable for generating the sampling clock by sampling the fed back read data strobe signal according to the random clock;
a first counter suitable for generating the first counting signal by counting the random clock;
a second counter suitable for generating the second counting signal by counting the sampling clock; and
a duty detector suitable for detecting the duty ratio of the read data strobe signal based on the first counting signal and the second counting signal.

12. The stacked semiconductor device of claim 11,
wherein the monitoring circuit further includes a random oscillator suitable for generating the random clock having a random period, and
wherein the random oscillator is activated according to the monitoring enable signal and deactivated according to a full-counting signal which is transferred from the first counter when the first counting signal is fully counted to reach a maximum.

13. The stacked semiconductor device of claim 11, wherein the sampler includes:
a flip-flop suitable for latching the fed back read data strobe signal at a rising edge of the random clock to output a pre-sampling clock; and
a filter suitable for filtering the pre-sampling clock according to the random clock to output the sampling clock.

14. The stacked semiconductor device of claim 11,
wherein the monitoring circuit further includes a multiplexer suitable for outputting, as an operational clock, one of an internal clock and the sampling clock according to the monitoring mode signal, and
wherein the second counter includes a multiple input signature register (MISR) circuit for performing a function of a linear feedback shift register (LFSR) according to the operational clock.

15. A semiconductor device comprising:
a sampler suitable for generating a sampling clock by sampling a data strobe signal according to a random clock;
a first counter suitable for generating a first counting signal by counting the random clock;
a second counter suitable for generating a second counting signal by counting the sampling clock; and
a duty detector suitable for detecting a duty ratio of the data strobe signal based on the first and second counting signals.

16. The semiconductor device of claim 15, wherein the second counter is a multiple input signature register (MISR) circuit suitable for performing a function of a linear feedback shift register (LFSR) according to the sampling clock.

* * * * *